(12) United States Patent
Yamada et al.

(10) Patent No.: US 6,466,452 B2
(45) Date of Patent: Oct. 15, 2002

(54) SOCKET

(75) Inventors: Shoji Yamada; Takeshi Hashimoto, both of Yamato (JP)

(73) Assignee: Quasar System, Inc., Yamato (JP)

( * ) Notice: Subject to any disclaimer, the term of this patent is extended or adjusted under 35 U.S.C. 154(b) by 0 days.

(21) Appl. No.: 09/802,235

(22) Filed: Mar. 8, 2001

(65) Prior Publication Data

US 2002/0060905 A1 May 23, 2002

(30) Foreign Application Priority Data

Nov. 22, 2000 (JP) ........................ 2000-356105

(51) Int. Cl.[7] ................................ H05K 7/14
(52) U.S. Cl. ................ 361/801; 361/756; 361/802; 439/681
(58) Field of Search ............... 361/756, 759, 361/801, 802; 439/326–328, 50, 53, 60, 630–638, 681

(56) References Cited

U.S. PATENT DOCUMENTS

| | | | | |
|---|---|---|---|---|
| 4,354,724 A | * | 10/1982 | Jarmy | 439/681 |
| 5,387,132 A | * | 2/1995 | Sarver et al. | 439/633 |
| RE35,344 E | * | 10/1996 | Fry et al. | 439/537 |
| 5,888,086 A | * | 3/1999 | Yaegashi et al. | 439/326 |
| 6,045,407 A | | 4/2000 | Yamada et al. | |

FOREIGN PATENT DOCUMENTS

| | | |
|---|---|---|
| JP | 08-055651 | 2/1996 |
| JP | 10-294154 | 11/1998 |
| JP | 11-185903 | 7/1999 |
| JP | 2000-058198 | 2/2000 |

* cited by examiner

Primary Examiner—Kamand Cuneo
Assistant Examiner—Tuan Dinh
(74) Attorney, Agent, or Firm—Frishauf, Holtz, Goodman & Chick, P.C.

(57) ABSTRACT

The present invention provides a socket 10 which has a housing 20 having a slot 22 for receiving one edge 13 of a daughter board 11 on which terminal portions 12 are mounted, and contacts provided within the slot and pressed against respective terminals of the daughter board 11. From both sides of the housing, latches 31 extend toward the opening direction of the slot. When the daughter board is pressed down against the urging force of the contacts, the latches engage with both side edges 16 of the daughter board. At the position shifted from the center of the edge of the daughter board toward either side edge, a notch 14 is provided, and at the corresponding position of the slot of the housing, a projection for positioning to be fitted in the notch is formed, and at least one side of the projection for positioning, an elastic member 40 for pressing it against the inner side wall of the notch of the daughter board is provided.

2 Claims, 10 Drawing Sheets

SOCKET

FIELD OF THE INVENTION

The present invention relates to a socket for installing a daughter board on which electronic parts are mounted, such as a memory module.

BACKGROUND OF THE INVENTION

In the field of personal computers and the like, when a daughter board on which electronic parts are mounted, such as a memory module, is connected to a mother board, the connection is usually made through a socket which is fixedly mounted on the mother board by soldering or the like. As such a type of socket, in order to make the installation of the daughter board easy, a zero insertion force (ZIF) type socket has been often used.

In the use of the ZIF type socket, a daughter board is inserted in a slantwise direction relative to the socket, and after the insertion, the daughter board is moved to the position parallel to the socket, thereby engaging both ends of the daughter board with latches disposed at both sides of the socket to fix the position.

FIGS. 9 and 10 show an example of a conventional socket. This socket 1 has the substantially same structure as the one disclosed in Japanese Unexamined Patent Publication No. 8-55651 (55651/1996), wherein contacts 2a exposed from the lower face of a housing 2 are attached to a mother board, not shown in the drawing, by soldering. Further, arms 3 are oppositely disposed at both ends of the housing 2, and latches 4 are attached and fixedly mounted on the opposed faces of the arms 3.

When a terminal portion 5a formed on an edge 5c of a daughter board 5 is inserted in a slantwise direction relative to a socket 2b of the housing 2, notches 5b formed at both ends of the daughter board 5 are kept at the position at which they will be in alignment with hook members 4a formed on the latches 4.

When the daughter board 5 is pressed downward in the drawing around the edge 5c on which the terminal portions 5a are formed, the hook members 4a abut on the notches 5b and are thereby pressed outwardly and the daughter board 5 enters beneath the hook members 4a, and as shown in FIG. 10, the upper and lower faces of the daughter board 5 are sandwiched between the hook members 4a and tongue members 3a curvedly formed on the arms 3, and the lower faces of the hook members 4a of the latches 4 are engaged with the upper edge portions of the notches 5b, thereby securing the position of the daughter board.

At the position shifted from the center of the edge 5c of the daughter board 5 toward either one side edge, a notch 5d is formed. In a slot 2b of the socket 1, a projection 2c for positioning is provided corresponding to the notch 5d.

As a result, when the edge 5c of the daughter board 5 is inserted into the slot 2b of the socket 1, if the upper and lower faces of the daughter board are upside down, the projection 2c for positioning abuts on the edge 5c so that unwanted insertion can not be made. Further, if the daughter board is inserted appropriately, the notch 5d of the edge 5c fits in the projection 2c for positioning, whereby the contacts 2a of the socket 2 are in alignment with the terminal portions 5d of the daughter board 5.

However, in the conventional socket 1, due to the dimensional error unavoidable in the production, looseness is caused to some extent between the projection 2c for positioning formed on the slot 2b and the notch 5d formed on the edge 5c of the daughter board 5. Accordingly, when the alignment of the terminal is made to have an extremely narrow pitch width, there is a possibility that the position of the contacts 2a of the socket 1 may be out of alignment with the position of the terminal portions 5d of the daughter board 5.

SUMMARY OF THE INVENTION

Accordingly, it is an object of the present invention to provide a socket wherein even if the alignment of the terminal portions of the daughter board is made to have a further narrow pitch width, the position of the contacts 2a of the socket 1 is kept to be in alignment with the position of the terminal portions of the daughter board.

In order to accomplish the above objects, the first aspect of the present invention provides a socket for installing a daughter board having electrical parts mounted thereon and terminal portions aligned with a predetermined pitch on one edge, which comprises:

a housing comprising a slot for receiving the edge of the daughter board on which the terminal portions are aligned, and contacts which are provided on an inner side of the slot and are to be contacted to the terminal portions with pressure, and a pair of latches which extend from both sides of the housing toward an opening direction of the slot and engage with both sides of the daughter board when the edge of the daughter board is inserted into the slot and moved down against the urging force of the contacts, wherein in the edge of the daughter board, a notch is formed at a position shifted from the center of the edge toward either side edge, in the slot of the housing, a projection for positioning is formed at a position corresponding to the notch which is to be inserted into the notch, and on at least one side of the projection for positioning, an elastic member which is to be pressed against an inner side wall of the notch in the edge of the daughter board is provided.

According to the first aspect of the present invention, when an edge of a daughter board on which a terminal portions are disposed is inserted into a slot of a socket, a projection for positioning disposed in the slot is fitted in a notch formed at the edge of the daughter board, and since an elastic member is disposed on at least one side of the projection for positioning, the projection for positioning can be inserted into the notch in such a state that the elastic member abuts on at least one inner side wall of the notch of the daughter board with pressure.

As a result, when elastic members are disposed at both sides of the projection for positioning, the daughter board is relatively moved to such a position that both elastic members are well balanced during the step of inserting the daughter board into the slot of the socket, thereby keeping the alignment of the terminals of the daughter board and the contacts of the socket. Further, when the elastic member is disposed at one side of the projection for positioning, during the step for inserting the daughter board into the slot of the socket, the side face of the projection for positioning on which no elastic member is disposed is pressed against the corresponding inner side face of the notch of the daughter board, thereby keeping the alignment of the terminals of the daughter board and the contacts of the socket.

In order to accomplish the above objects, the second aspect of the present invention provides a socket for installing a daughter board having electrical parts mounted thereon and terminal portions aligned with a predetermined pitch on one edge, which comprises:

a housing comprising a slot for receiving the edge of the daughter board on which the terminal portions are aligned, and contacts which are provided on an inner side of the slot and are to be contacted to the terminal portions with pressure, and a pair of latches which extend from both sides of the housing toward an opening direction of the slot and engage with both sides of the daughter board when the edge of the daughter board is inserted into the slot and moved down against the urging force of the contacts, wherein in the edge of the daughter board, a notch is formed at a position shifted from the center of the edge toward either side edge, in the slot of the housing, a projection for positioning is formed at a position corresponding to the notch which is to be inserted into the notch, and an elastic member is provided at either side edge of the housing, the elastic member being used to press the either side edge of the daughter board to contact the notch against the projection for positioning with pressure.

According to the second aspect of the present invention, when an edge of a daughter board on which terminals are disposed is inserted into a slot of a socket, a projection for positioning formed in the slot is fitted in a notch formed at an edge of the daughter board, and in such instance, an elastic member disposed at either edge portion of a housing is pressed against a side edge of the daughter board and the notch is thereby pressed against the projection for positioning, thereby keeping the alignment of the terminals of the daughter board and the contacts of the socket.

BRIEF DESCRIPTION OF THE DRAWINGS

FIG. 3(a) is a plan cross-sectional view and FIG. 3(b) is a front view.

FIG. 6(a) is a plan cross-sectional view and FIG. 6(b) is a front cross-sectional view.

DESCRIPTION OF THE PREFERRED EMBODIMENTS

Hereinafter, the first aspect of the present invention will be described in further detail with reference to FIGS. 1 to 6.

Figure 1:
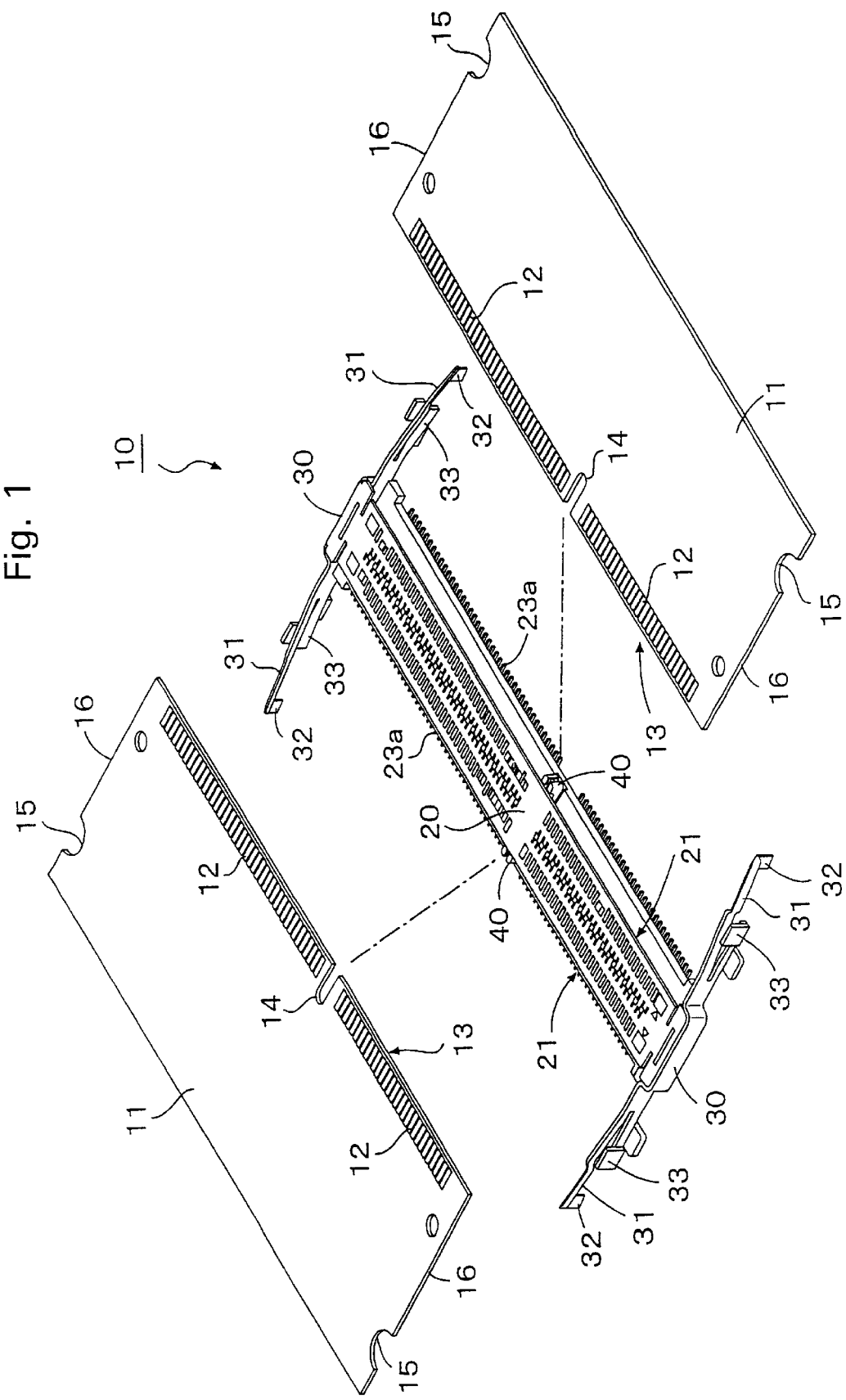
FIG. 1 is a perspective view showing a mode of carrying out one embodiment of the socket of the present invention.
Figure 4:
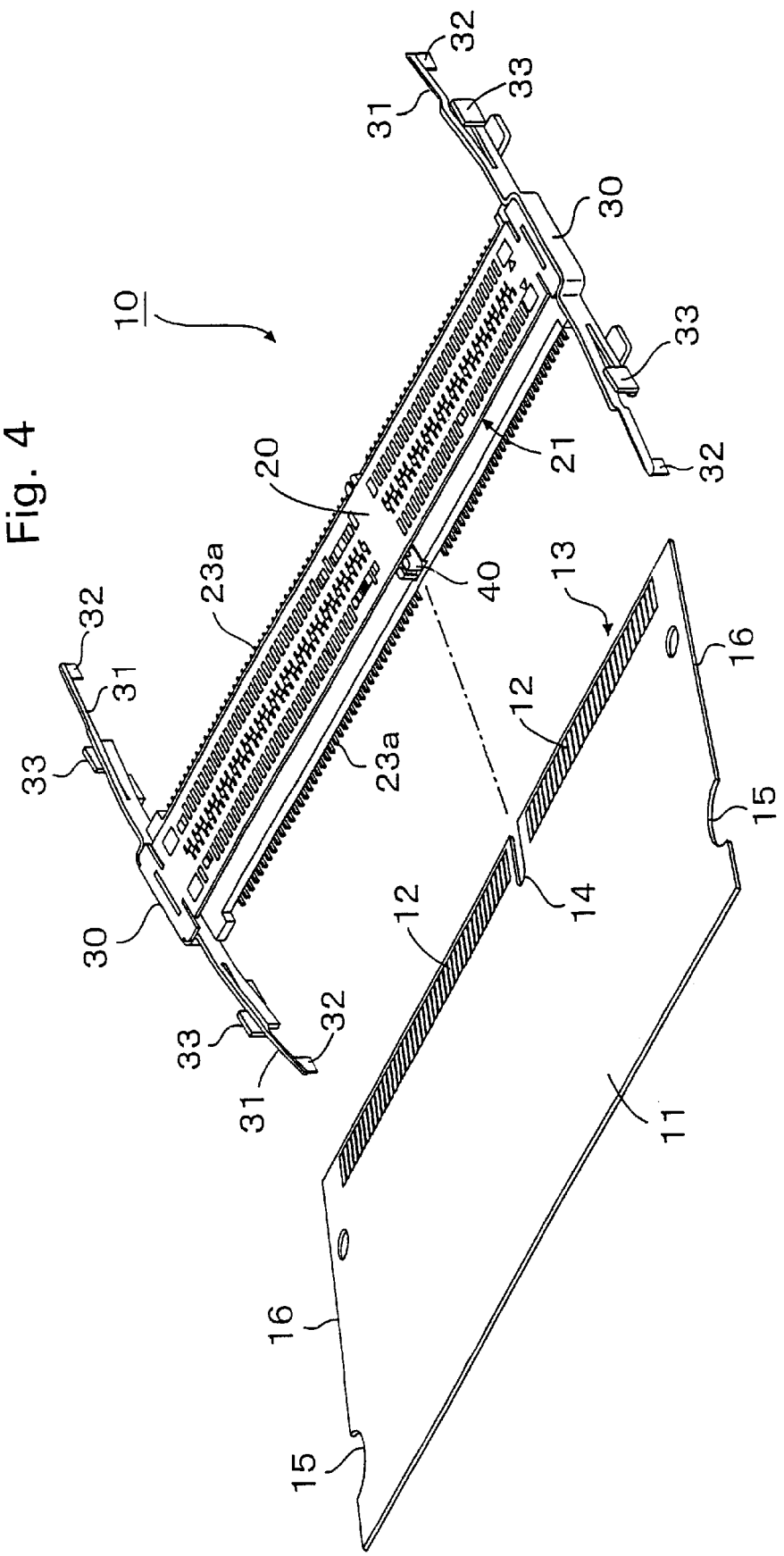
FIG. 4 is a perspective view showing a state where a daughter board is inserted into the socket.
Figure 5:
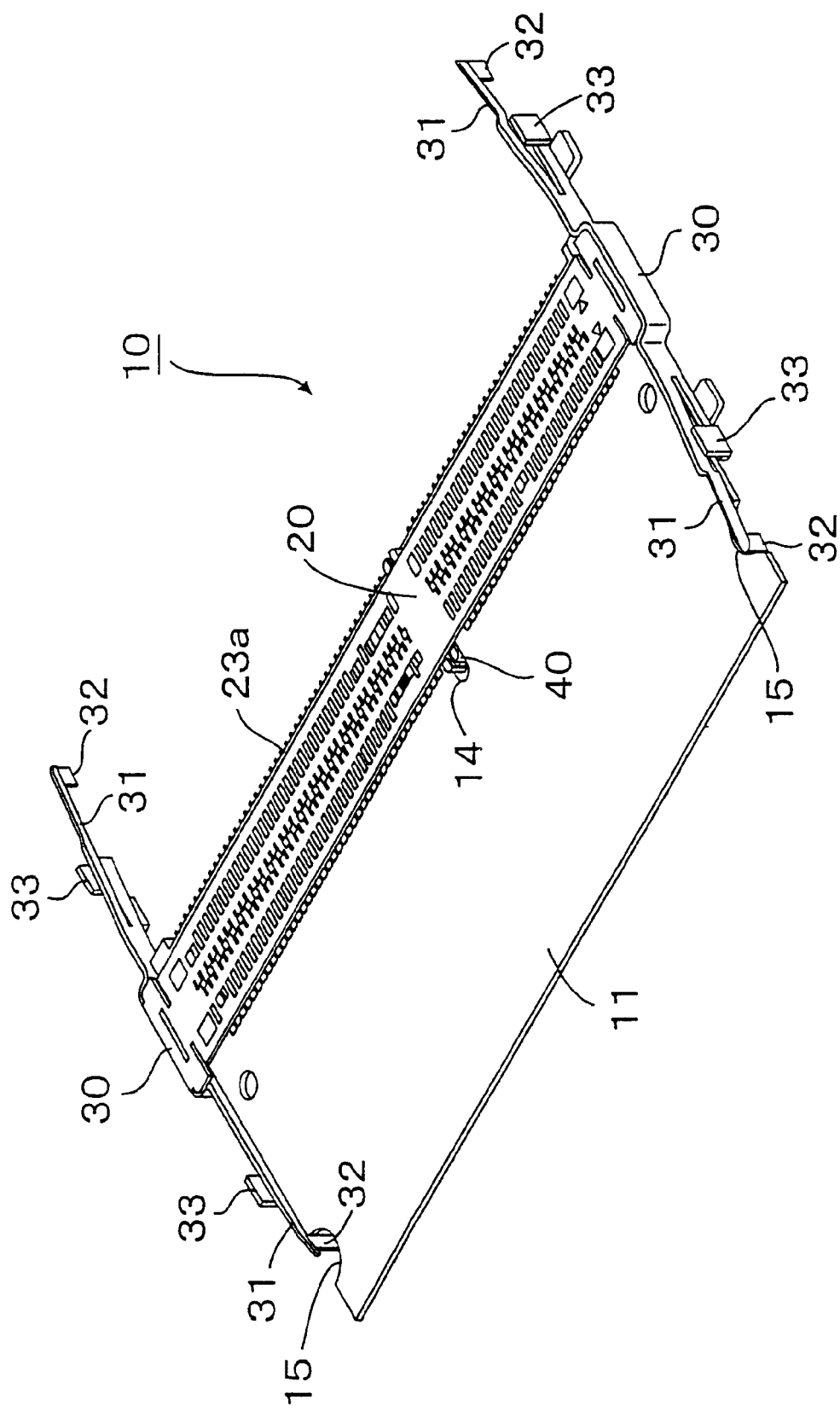
FIG. 5 is a perspective view showing a state where a daughter board is installed into the socket.

As shown in FIGS. 1, 4 and 5, a socket 10 comprises a housing 20 formed by molding an insulating material such as a synthetic resin into a substantially quadrilateral column shape, and securing metal means 30 installed at both ends of the housing 20.

At the front and rear faces of the housing 20, are provided slots 21, 21 to which edges 13 of a pair of daughter boards 11 on which terminal portions 12 are mounted are to be inserted, respectively. The terminal portions 12 are formed on both faces of the edge 13. At the position shifted from the center of the edge 13 of the daughter board 11 toward either side edge, a slit-shape notch 14 is formed. Further, at both side edges 16 of the daughter board 11, U-shape notches 15 are formed.

From both sides of the securing metal means 30, a pair of opposedly formed latches 31 extend so that the slots 21, 21 are sandwiched. The respective latches 31 are formed by bending a metal flat plate in a curved arm shape, and the front end portions of the pair of opposedly formed latches 31 are bent in an arcuate shape in such a direction that the front end portions come nearer.

At the front end portion of each latch 31, a projection 32 which is to be fitted in each of notches 15 formed at both side edges of the daughter board 11 is formed in a downwardly projected shape. By fitting this projection 32 in the notch 15, dislocation of the daughter board 11 can be prevented.

From both side portions of the securing metal means 30, supporting portions 33 having a shape such that they are branched from the latches 31 extend. The supporting portions 33 engage with the lower face of both side edges 16 of the daughter board 11, and function to hold and secure both side edges 16 of the daughter board 11 between the space with the latch 31.

Further, in the slots 21, 21, contact portions of the contacts 23 are aligned in upper and lower two rows. Each contact 23 contacts with the corresponding terminal of the terminal portions 12 formed on one edge of the daughter board 11. Leg portions 23a of the contacts 23 project from the lower face of the housing 20 and are attached to a mother board, not shown in the drawing, by soldering.

The socket 10 used in this embodiment of the present invention is of a so-called ZIF type socket, and the contact portions of the contacts 23 exposed in the slots 21, 21 hold the terminal portions 12 of the daughter board 11, and through the terminal portions 12, urges rotatively the daughter board 11 in a direction such that the daughter board 11 will become apart from the mother board (upwardly in FIGS. 1, 4 and 5).

The characteristic portion of this embodiment of the present invention resides in an elastic member 40 attached to a projection for positioning 22 provided in each of the slots 21, 21. Namely, when the projection for positioning 22 fits to the notch 14 disposed in the edge 13 of the daughter board 11, it restricts the direction of inserting the daughter board 11 and also functions to make the contacts 23 in alignment with the terminal portions 12.

Figure 2:
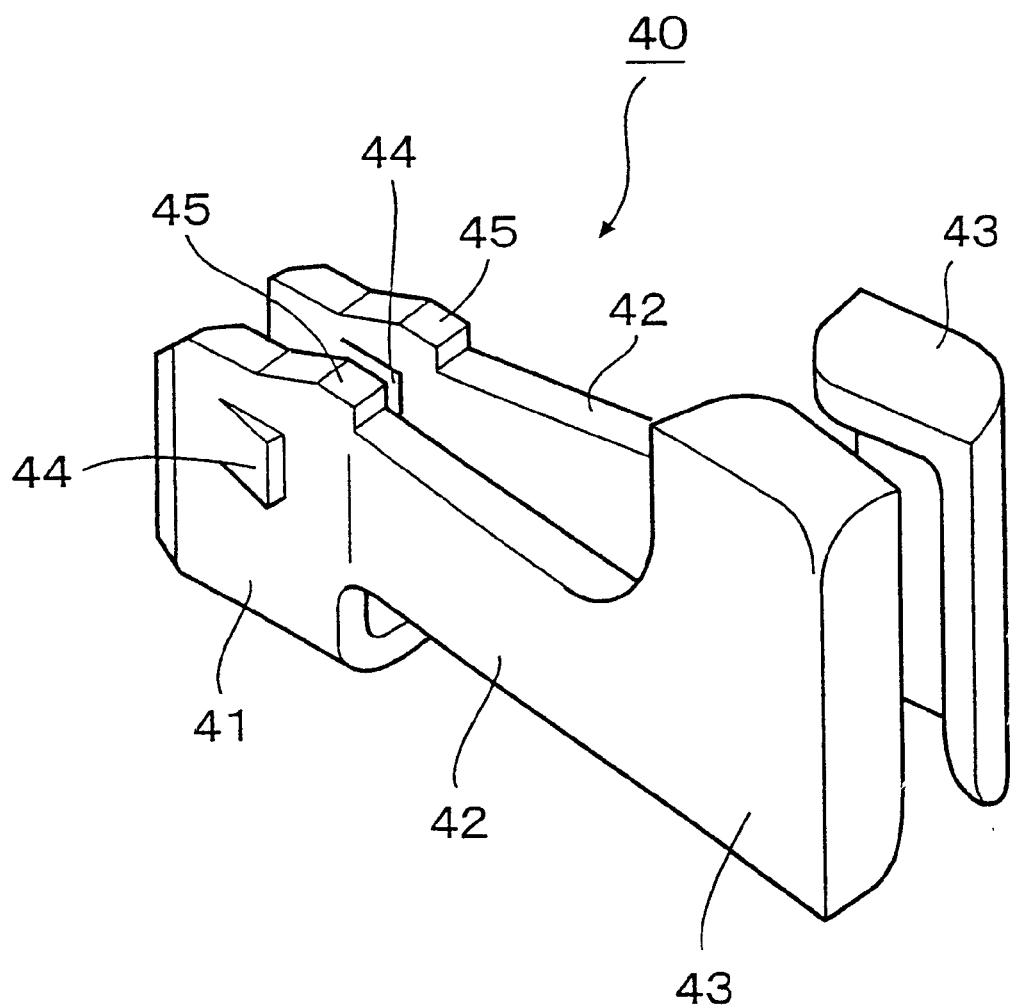
FIG. 2 is a perspective view showing an elastic member taken out from the socket.

In this embodiment, to the projection for positioning 22, an elastic member 40 as shown in FIGS. 2 and 3 is attached. The elastic member 40 is constituted by a base portion 41 bent in a U-shape in the front view, a pair of arms which expand in a V-shape and extend forwardly, and guide portions 43 having a curved shape disposed at the front ends of the arms 42.

Figure 3A:
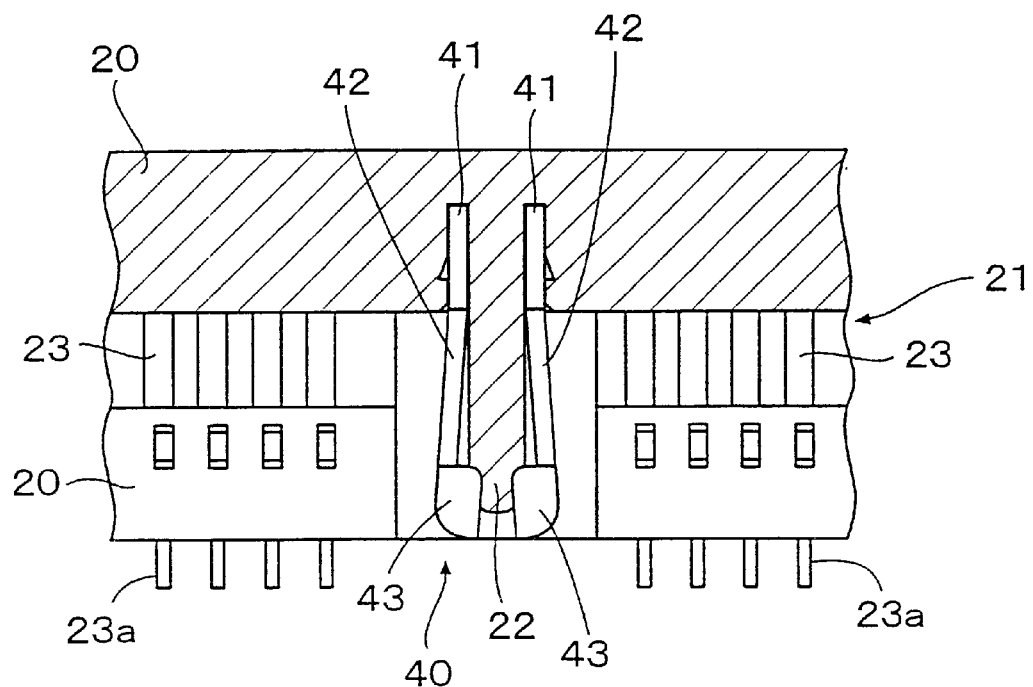
FIG. 3(a) and FIG. 3(b) are enlarged views of a slot portion of the socket.
Figure 3B:
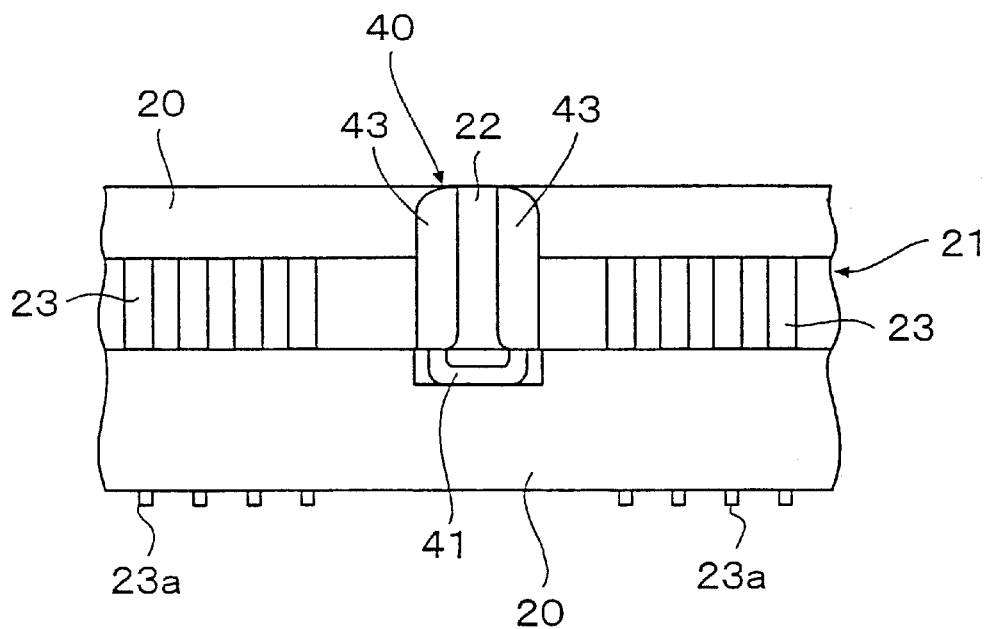

At the base portion 41, a pair of hooks 44 formed in such a shape that they protrude or rise sidewise and projecting portions 45 formed at upper edge portions thereof are disposed. As shown in FIGS. 3(a) and 3(b), dislocation can be prevented by inserting the elastic member 40 into the base portion of the projection for positioning 22 of the slot 21.

The curved shape guide portion 43 has a curved shape such that the front end portion of the projection for positioning 22 will be enclosed. The guide portion 43 is inserted smoothly into the notch 14 of the daughter board 11, and at the same time, elastically pressed against the inner side wall of the notch 14 by the urged force of the arm 42 expanding in a V-shape.

Then, the functions achieved by this embodiment will be described. As shown in FIG. 4, firstly, when the edge 13 of the daughter board 11 on which terminal portions 12 are mounted is inserted in a slantwise direction into the slot 21 formed in the housing 20 of the socket 10 which is attached to a mother board by soldering, the terminal portions 12 formed on the upper and lower faces of the edge 13 are held or clamped between the contact portions of the contacts 23 aligned at the upper and lower sides in the inside of the slot 21.

Next, in a direction parallel to the mother board (downwardly in FIG. 4), the daughter board 11 is moved rotatively against the clamping force of the contact portions of the contacts 23. Then, the latches 31, 31 extending from both sides of the securing metal means 30 securely mounted at both side of the housing 20, are pressed by both side edges of the daughter board 11 and expanded outwardly.

Then, as shown in FIG. 5, the projections 32 formed at the front ends of the latches 31, 31 fit in the notches 15, and thereby the daughter board 11 is further slanted toward the horizontal direction. By fitting the projections 32 in the notches 15, it can be confirmed that the terminal portions 12 of the daughter board 11 have been accurately inserted to the deep section of the slots 21, 21, and at the same time, displacement of the daughter board 11 can be prevented.

When the daughter board 11 is kept in a substantially horizontal state, the latches 31, 31 come over both side edges 16, 16 of the daughter board 11, and engage with the upper faces of both side edges 16, 16 by the restoring force of the latches 31, 31. On the other hand, the lower faces of both side edges 16, 16 are engaged with the supporting portions 33 extending from both side portions of the securing metal means 30 and having a shape such that they branch from the latches 31, and resultantly both side edges 16, 16 are clamped and secured between the latches 31 and the supporting portions 33. The daughter board 11 is thus installed.

Further, when the daughter board 11 is detached from the socket 19, the latches 31, 31 are expanded outwardly. Then, by the rotatively urging force by the contact portions of the contacts 23 which clamp the terminal portions 12 of the daughter board 11, the daughter board 11 is rotatively moved in a direction such that it will become apart from the mother board, and therefore the daughter board can be easily detached.

In this embodiment, when the edge 13 of the daughter board 11 on which the terminal portions 12 are mounted is inserted into the slot 21 of the housing 20, the following functions for positioning can be achieved.

Namely, when the edge 13 of the daughter board 11 is inserted into the slot 21 of the housing 20, the notch 14 formed at the edge 12 is aligned with and inserted into the projection 22 of the housing 20. At both sides of the projection 22, arms 42 of an elastic member 40 and, at their front ends, curved shape guides 43 are provided. As a result, the curved shape guide 43 of the elastic member 40 is inserted into the notch 14 while the curved shape guide 43 is pressed against the inner side face of the notch 14.

Figure 6A:
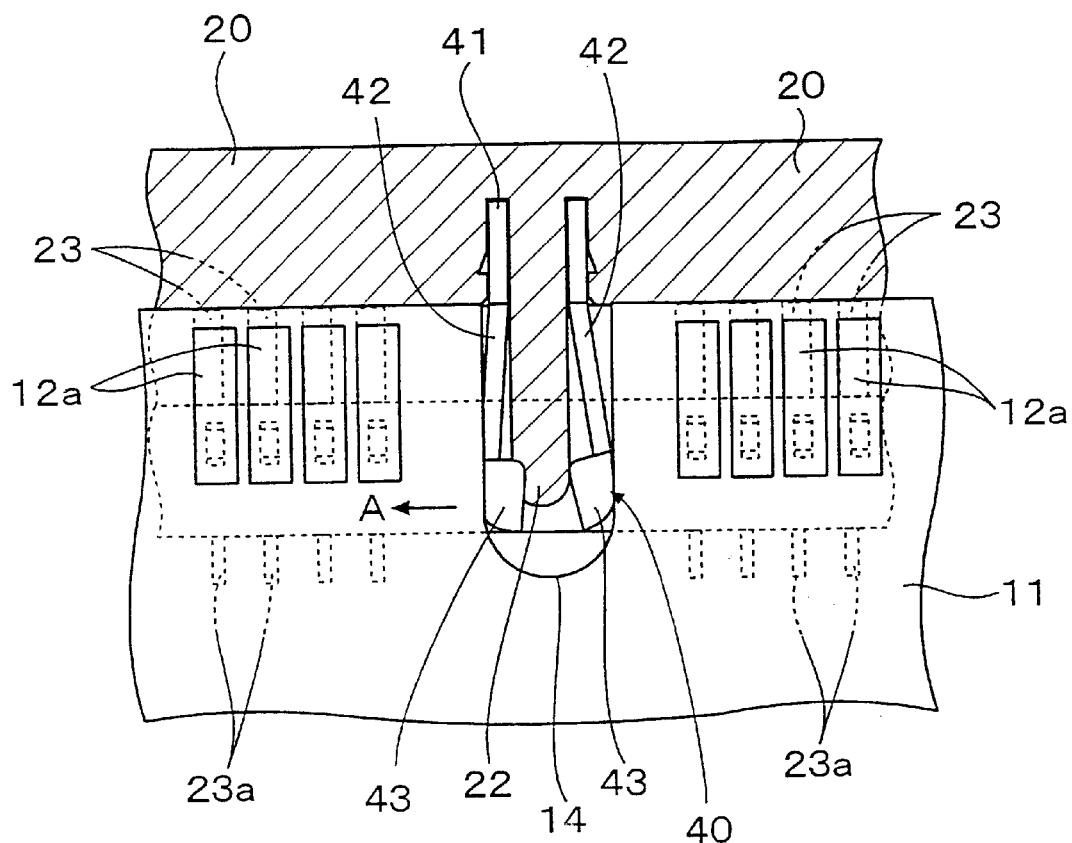
FIG. 6(a) and FIG. 6(b) show the relation between a projection for positioning and a notch when a daughter board in inserted into the socket.
Figure 6B:
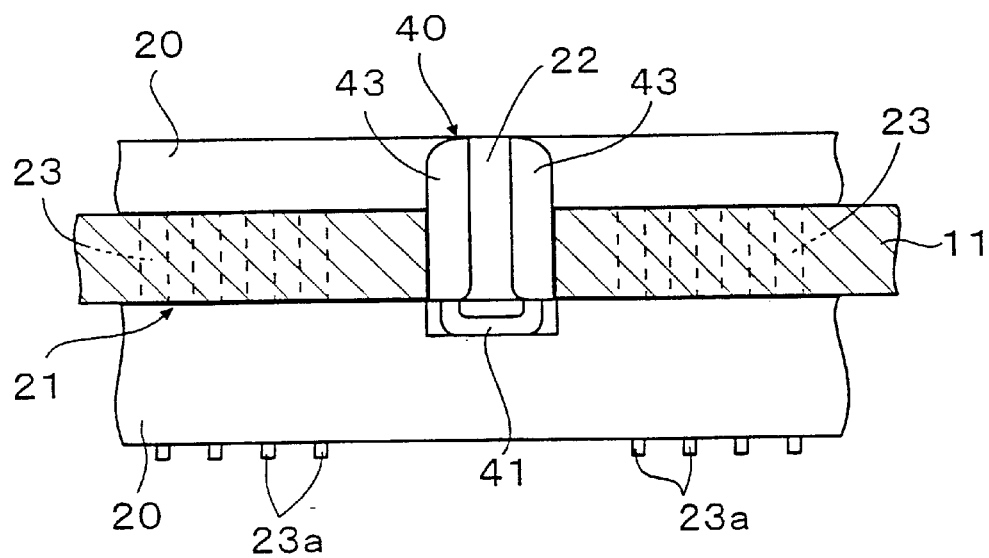

Since the curved shape guides 43 are pressed against the inner side faces of the notch 14 by the urged force of the arms 42, when the terminals 12a of the daughter board 11 are inserted in a sidewise shifted fashion relative to the contacts 23 of the housing 20 as shown in, for example, FIG. 6(a), a curved guide 43 of one side is pressed against the corresponding inner side wall of the notch 14 more strongly, and during a step of deeply inserting the daughter board 11 into the slot 21, the restoring force as indicated by the arrow A in FIG. 6(a) is imparted. As a result, the daughter board 11 is inserted into the slot 21 while the sidewise shift is corrected, and the position of insertion can be corrected so that the position of the terminals 12a of the daughter board 11 will be in alignment with the position of the contacts 23 of the housing 20.

The above functions and effects can be achieved without providing the elastic member 40 so far as the projection 22 and the notch 14 can be formed in alignment with each other. In reality, however, more or less looseness can not be avoided due to the error in production, and in the narrow pitch alignment of the terminals 12a in recent years, there has been a possibility that the position of the terminals 12a are shifted from the position of the contacts 23.

Further, in the above embodiment, the arms 42 and the curved shape guides 43 of the elastic member 40 are disposed at both sides of the projection 22. However, the arm 42 and the curved shape guide 43 of the elastic member 40 may be disposed at one side of the projection 22. In such an instance, the projection 22 is always presses against only one inner side face of the notch by the elastic member 40, and by designing the devices so that the terminals 12a will be in alignment with the contacts 23 in such a state, the shift of position between the terminals 12a and the contacts 23 can be prevented.

Figure 7:
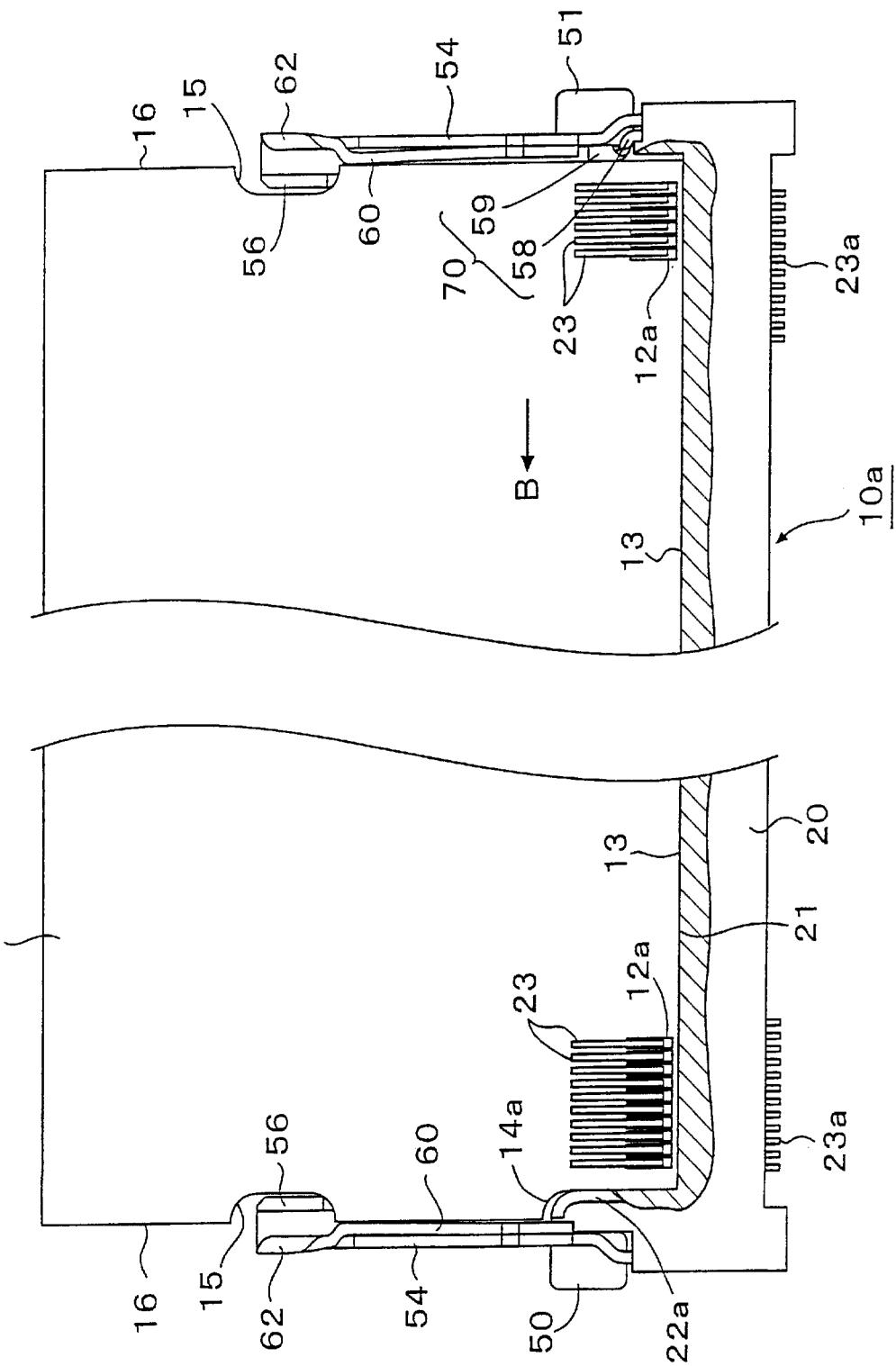
FIG. 7 is a plan view showing a mode of carrying out another embodiment of the socket of the present invention.
Figure 8:
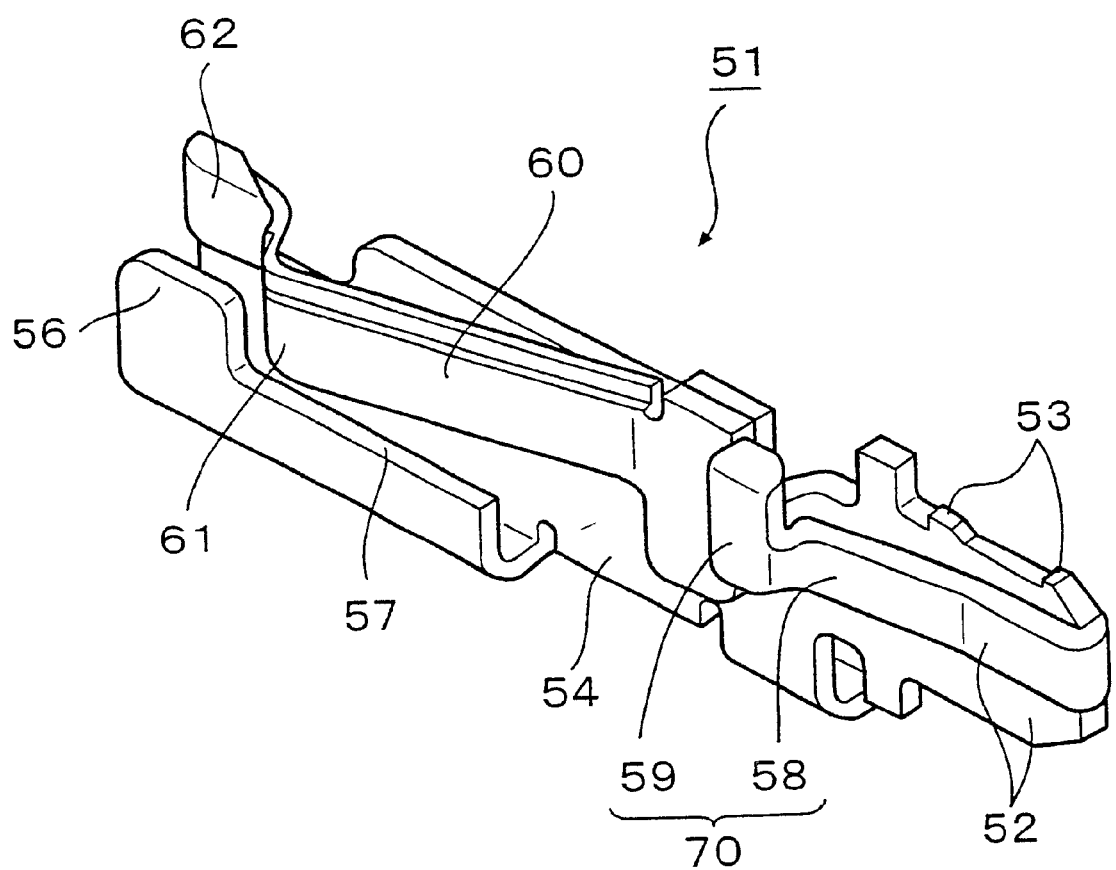
FIG. 8 is a perspective view showing a fixing means used for the socket which is taken out form the socket.
Figure 9:
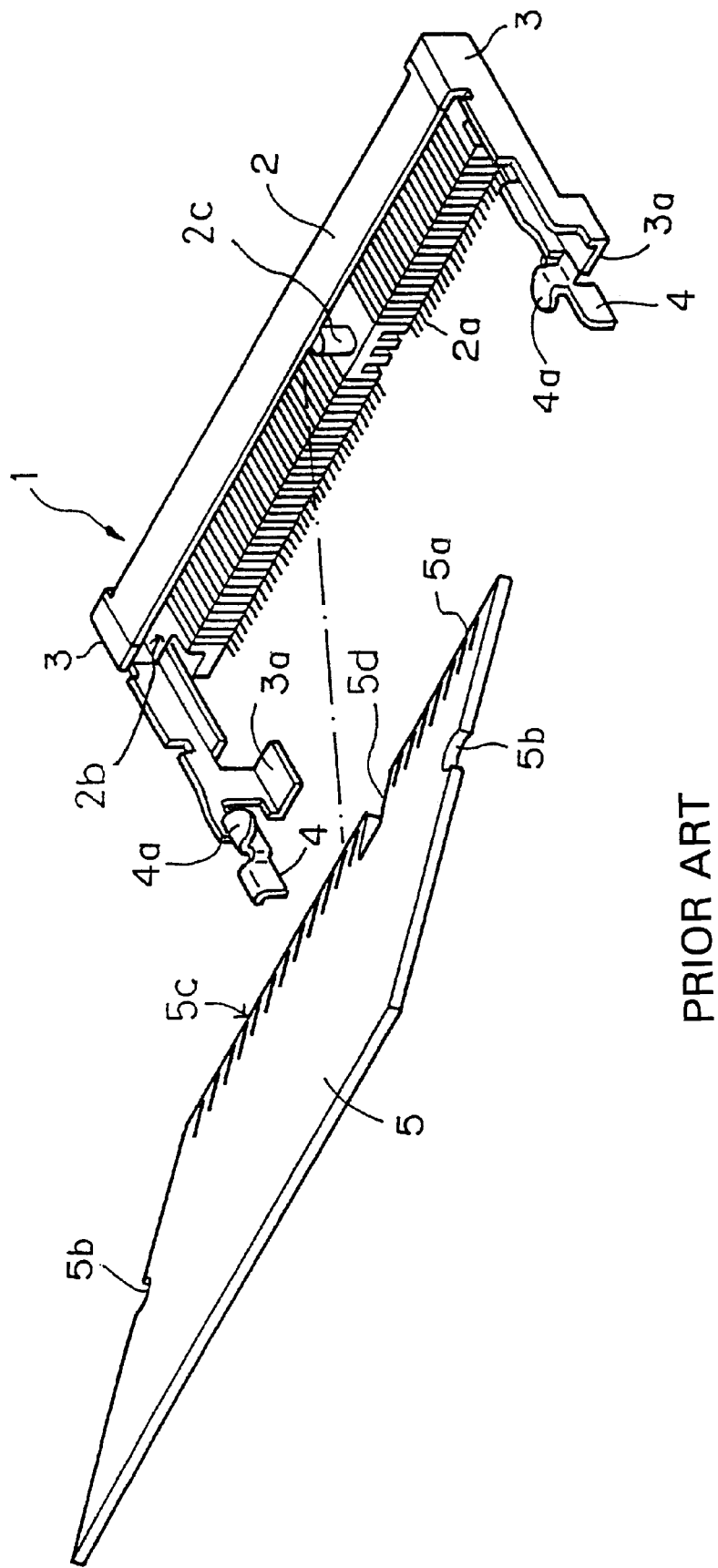
FIG. 9 is a perspective view showing an example of a conventional socket and a state where a daughter board is inserted thereinto.
Figure 10:
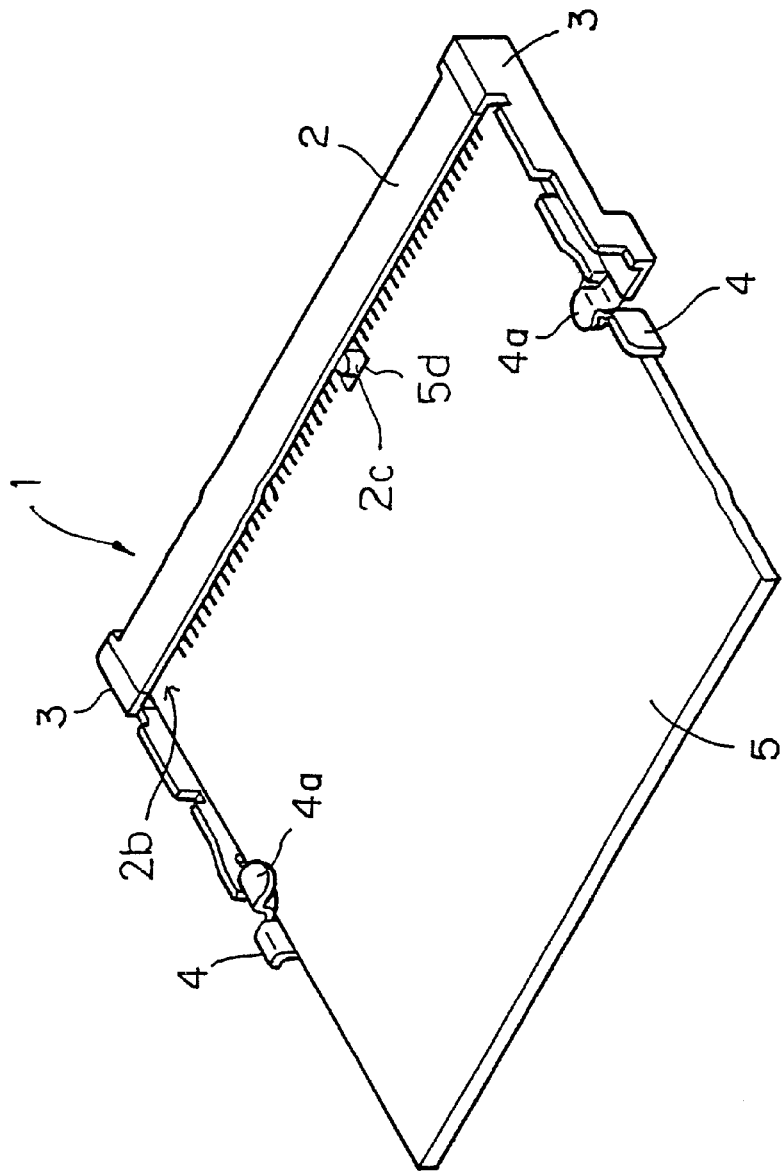
FIG. 10 is a perspective view showing a state where a daughter board is installed in the socket.

FIGS. 7 and 8 show another embodiment of the socket of the present invention. Here, the parts substantially same as the the above embodiment are indicated with the same numerals, and explanation for them will be omitted.

As shown in FIG. 7, in this embodiment, at one end portion of an edge 13 of a daughter board 11 on which terminals 12a are aligned, a notch 14a is formed by cutting an end portion of a side edge 16. A housing 20 of a socket 10a has a slot 21 which receives the edge 13 of the daughter board 11, and within the slot 21, contacts 23 are aligned with the same pitch as the terminals 12a. Further, at one end of the housing 20, a projection 22a for positioning which is to be fitted in the notch 14a is formed.

At both ends of the housing 20, a pair of securing metal means 50, 51 are installed. FIG. 8 shows one securing metal means 51. The securing metal means 51 is to be installed to an end portion for which the projection 22a for positioning of the housing 20 is not provided, and has an inserting end portion 52 to an installation slot of the housing 20 which is bent in a V-shape in the upper plan view. At the edge portion of the inserting end portion 52, projections 53 for preventing dislocation is provided.

A front end portion 54 of the inserting end portion 52 bent in a V-shape, projects substantially vertically from the end portion of the housing 20 toward the opening direction of the slot 21, and, at its front end, has a projection 56 which fits in the notch 15 formed at the side edge 16 of the daughter board 11. Further, the portion near the base portion of the projection 56 forms a supporting portion 57 which abuts on the lower face of the side edge 16 of the daughter board 11. Furthermore, a latch 60 extends from the halfway point of the front end portion 54 in such a fashion that it is bent inwardly. The base of the latch 60 is fixedly secured at the halfway point of the front end portion 54. A bending corner portion 61 of the latch 60 is disposed above the supporting portion 57 with a predetermined distance. Moreover, at the front end portion of the latch 60, a finger lever portion 62 is provided so that the securing metal means can be expanded outwardly for detachment of the daughter board 11.

Further, another front end portion 58 bent in a V-shape of the insertion end portion 52 a little protrudes in such a state that it is inserted into the installation slot of the housing 20, and, at its front end, has a pressing portion 59 formed in an inwardly curved shape. The front end portion 58 and the pressing portion 59 form an elastic member 70 in this embodiment.

Here, the securing metal means 51 to be attached at another end portion of the housing 20 has the same structure as the above securing metal means 50 provided that the pressing portion 59 is not disposed.

In this socket 10a, the edge 13 of the daughter board 11 on which the terminal portions 12 are mounted is inserted in a slantwise direction into the slot 21, and the daughter board 11 is moved down to the position parallel to the slot 21, whereby the projections 56 of the securing metal means 50, 51 are fitted in the notches 15 of the side edges 16 of the daughter board 11, and after the latches 60 expand outwardly, the projections 56 come over the upper faces of the side edges 16 of the daughter board 11 for engagement. As a result, both side edges 16 of the daughter board 11 are clamped and secured between the supporting members 57 and the latches 60 of the securing metal means 50, 51, and the projections 56 fit in the notches 15 to prevent dislocation.

In this embodiment when the daughter board 11 is inserted into the slot 21, by conducting the insertion so that the projection 22a for positioning formed at one end portion of the housing 20 is fitted in the notch 14a formed at the lower end of one side edge 16 of the daughter board 11, it becomes possible to restrict the insertion direction of the daughter board 11 and make the position of the terminals 12a of the daughter board 11 in alignment with the position of the contacts 23 of the socket 10a.

However, it is difficult from the aspect of production performance to accurately adjust the width of the daughter board 11 and the width of the slot 21, and it is therefore usual to design the width of the slot 21 slightly larger than the width of the daughter board 11. Accordingly, there are possibilities that the daughter board 11 moves horizontally in the slot 21 and that the position of the terminals 12a becomes out of alignment with the position of the contacts 23 due to the narrow pitch design of the terminals 12a.

Under such circumstances, in this embodiment, when the daughter board 11 is inserted into the slot 21, the pressing portion 59 of the elastic member 70 is elastically pressed against another side edge 16 of the daughter board 11. As a result, during insertion, the daughter board 11 is pressed in a direction of arrow B in FIG. 7, and the projection 22a for positioning of the housing 20 always abuts on the notch 14a of the daughter board 11. Accordingly, the terminals 12a and the contacts 23 can be securely contacted by predetermining the location of the terminals 12a and the contacts 23 based on the position where the projection 22a for positioning abuts on the notch 14a.

Here, in this embodiment, the notch 14a is formed at the lower end of one side edge 16 of the daughter board 11, the projection 22a for positioning is formed at another end portion of the housing 20. However, similarly as in the first embodiment, a notch 14 may be located at a position shifted toward either side edge on the edge 13 of the daughter board 11 and a projection 22 corresponding to the notch 14 may be disposed within the slot 21 of the housing 20. In such a case, by pressing the daughter board 11 with the elastic member 70, one side face of the projection 22 always abuts on the corresponding inner wall of the notch 14. Accordingly, by predetermining the location of the terminals 12a and the contacts 23 based on this position as the standard, it is possible to securely contact the terminals 12a with the contacts 23.

Further, in the above respective embodiments, a metallic spring member is used as the elastic member. However, for example, spring members made of a resin integratedly molded with the housing 20 may be used.

As explained above, in the present invention, when an edge of a daughter board on which terminal portions are mounted is inserted into a slot of a socket, the insertion is made so that the position of a notch provided at the edge of the daughter board will always be in a constant relationship with the position of a projection for positioning provided in the slot, whereby it becomes possible to make the position of the terminal portions of the daughter board in accurate alignment with the position of the contacts of the socket and to deal with the issues due to the tendency the narrow pitch of the terminal portions of the daughter board.

What is claimed is:

1. A socket for installing a daughter board adapted to receive electrical parts thereon and terminal portions aligned with a predetermined pitch on one edge, which comprises:

a housing comprising a slot for receiving the edge of the daughter board on which the terminal portions are aligned, and contacts which are provided on an inside portion such that when the daughter board is inserted in the slot, the contacts are in contact with the terminal portions, and a pair of latches which extend from both sides of the housing toward an opening direction of the slot and engage with both sides of the daughter board when the edge of the daughter board is inserted into the slot and moved down against the urging force of the contacts, wherein the edge of the daughter board includes a notch formed at a position which is not coincident with the center of the edge, in the slot of the housing, a projection for positioning is disposed at a position corresponding to the notch, said projection being received by the notch, and on at least one side of the projection for positioning, an elastic member is disposed which is to be pressed against an inner side wall of the notch in the edge of the daughter board so as to align the notch in the edge of the daughter board with the projection for positioning to electrically couple the terminal portions of the daughter board with the contacts of the housing.

2. A socket for installing a daughter board adapted to receive electrical parts thereon and terminal portions aligned with a predetermined pitch on one edge, which comprises:

a housing comprising a slot for receiving the edge of the daughter board on which the terminal portions are aligned, and contacts which are provided on an inside portion such that when the daughter board is inserted in the slot, the contacts are in contact with the terminal portions, and a pair of latches which extend from both sides of the housing toward an opening direction of the slot and engage with both sides of the daughter board when the edge of the daughter board is inserted into the slot and moved down against the urging force of the contacts, wherein the edge of the daughter board includes a notch formed at a position which is not coincident with the center of the edge, and an elastic member is provided at either side edge of the housing, the elastic member being used to press the either side edge of the daughter board to contact the notch against the projection for positioning with pressure so as to align the notch in the edge of the daughter board with the projection for positioning to electrically couple the terminal portions of the daughter board with the contacts of the housing.

* * * * *